(12) United States Patent
Sato et al.

(10) Patent No.: US 11,605,592 B2
(45) Date of Patent: Mar. 14, 2023

(54) METHOD TO FABRICATE METAL AND FERROMAGNETIC METAL MULTILAYER INTERCONNECT LINE FOR SKIN EFFECT SUPPRESSION

(71) Applicant: Intel Corporation, Santa Clara, CA (US)

(72) Inventors: Noriyuki Sato, Hillsboro, OR (US); Kevin Lin, Beaverton, OR (US); Kevin O'Brien, Portland, OR (US); Hui Jae Yoo, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 931 days.

(21) Appl. No.: 16/232,524

(22) Filed: Dec. 26, 2018

(65) Prior Publication Data

US 2020/0211974 A1 Jul. 2, 2020

(51) Int. Cl.
*H01L 23/532* (2006.01)
*H01L 43/10* (2006.01)
*H01L 43/12* (2006.01)
*H01L 23/522* (2006.01)
*H01L 21/768* (2006.01)
*H01L 21/3213* (2006.01)

(52) U.S. Cl.
CPC .. *H01L 23/53209* (2013.01); *H01L 21/76877* (2013.01); *H01L 23/5226* (2013.01); *H01L 43/10* (2013.01); *H01L 43/12* (2013.01); *H01L 21/32134* (2013.01); *H01L 21/32139* (2013.01); *H01L 21/76843* (2013.01)

(58) Field of Classification Search
CPC ........... H01L 23/53209; H01L 23/5226; H01L 21/76877; H01L 43/10; H01L 43/12; H01L 21/32134; H01L 21/32139; H01L 21/76843
USPC ........................................................ 257/751
See application file for complete search history.

(56) References Cited

U.S. PATENT DOCUMENTS

| | | | | |
|---|---|---|---|---|
| 2008/0295879 A1* | 12/2008 | Atanackovic | ........... | H01L 35/32 250/338.2 |
| 2012/0074511 A1* | 3/2012 | Takahashi | ............. | H01L 27/228 257/E27.005 |
| 2012/0217476 A1* | 8/2012 | Ikeno | .................... | G11C 11/161 257/E43.001 |
| 2014/0015076 A1* | 1/2014 | Gan | ..................... | H01F 41/302 257/421 |

* cited by examiner

*Primary Examiner* — Tu-Tu V Ho
(74) *Attorney, Agent, or Firm* — Schwabe, Williamson & Wyatt, P.C.

(57) ABSTRACT

A multilayer conductive line is disclosed. The multilayer conductive line includes a dielectric layer, a Ta barrier layer on the dielectric layer and a superlattice on the Ta barrier layer. The superlattice includes a plurality of interleaved ferromagnetic and non-ferromagnetic material.

19 Claims, 5 Drawing Sheets

200

METHOD TO FABRICATE METAL AND FERROMAGNETIC METAL MULTILAYER INTERCONNECT LINE FOR SKIN EFFECT SUPPRESSION

TECHNICAL FIELD

Embodiments of the disclosure pertain to the fabrication of a metal and ferromagnetic metal multilayer interconnect line and, in particular, the fabrication of a metal and ferromagnetic metal multilayer interconnect line for skin effect suppression.

BACKGROUND

The use of new materials and processes in the interconnect or back-end-of-line (BEOL) portion of integrated circuit (IC) process flow is a part of a quest to provide interconnects with improved density and performance for ICs. Subtractively patterned aluminum alloys and damascene tungsten plugs are currently the most widely used types of BEOL interconnects. However, a conversion to copper damascene approaches driven by a need for interconnects that provide higher performance and reliability is currently in progress.

Skin effects affect the performance of interconnects. Skin effects are a condition of alternating electric current (AC) in a conductor that is characterized by a current distribution that is largest near the surface of the conductor, and that decreases with depth in the conductor. Metal/ferromagnetic metal multilayer interconnects suppress skin effects because of the negative permeability of ferromagnetic metals at radio frequencies (RF). The fabrication of metal/ferromagnetic metal multilayer interconnects require a subtractive patterning process. In a conventional approach, a lift-off technique is used as a part of the subtractive patterning process. Lift off techniques involve the removal of a target metal layer by removing a sacrificial material upon which it rests. During this process, remnants of unwanted parts of the target metal layer may be left on the wafer and cause the contamination of adjacent materials. Thus, because of such contamination, subtractive processes can be unsatisfactory for many interconnect applications.

DESCRIPTION OF THE EMBODIMENTS

Figure 1A:
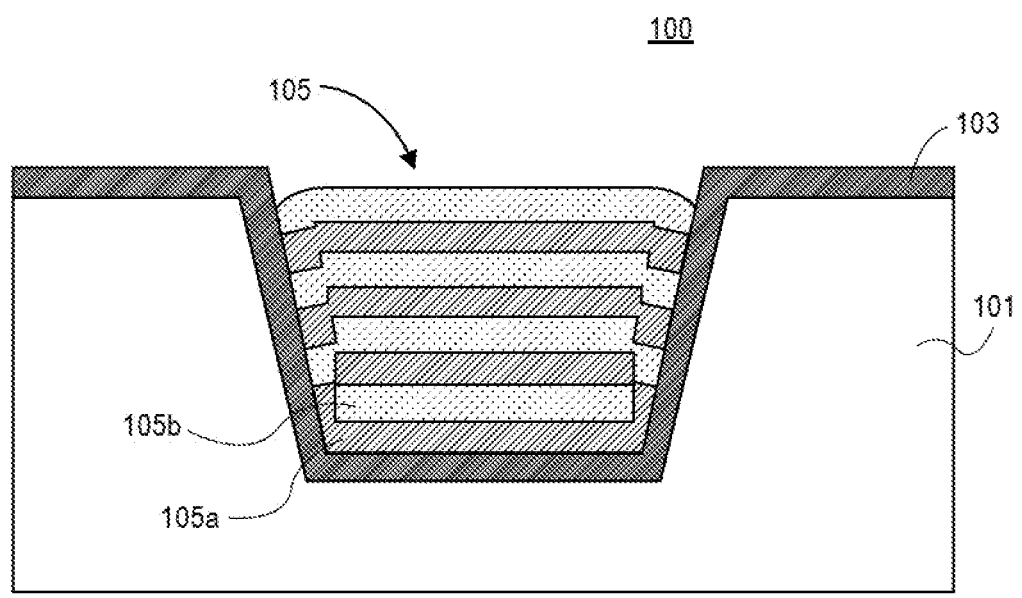
FIG. 1A is an illustration of a cross-section of a multilayered interconnect structure according to an embodiment.

The fabrication of a metal and ferromagnetic metal multilayer line for skin effect suppression is described. It should be appreciated that although embodiments are described herein with reference to example metal and ferromagnetic metal multilayer lines, the disclosure is more generally applicable to metal and ferromagnetic metal multilayer line implementations as well as other type metal and ferromagnetic metal multilayer line implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Skin effects affect the performance of interconnects. Skin effects are a condition of alternating electric current (AC) in a conductor that is characterized by a current distribution that is largest near the surface of the conductor, and that decreases with depth in the conductor. Metal/ferromagnetic metal multilayer interconnects suppress skin effects because of the negative permeability of ferromagnetic metals at radio frequencies (RF). The fabrication of metal/ferromagnetic metal multilayer interconnects require a subtractive patterning process. In a conventional approach, a lift-off technique is used as a part of the subtractive patterning process. Lift off techniques involve the removal of a target metal layer by removing a sacrificial material upon which it rests. During this process remnants of unwanted parts of the target metal layer may be left on the wafer and cause the contamination of adjacent materials. Thus, because of such contamination, subtractive processes can be unsatisfactory for many interconnect applications.

An approach that addresses the shortcomings of previous approaches is disclosed herein. For example, as part of a disclosed process, a metal/ferromagnetic metal (e.g., can be metal/metal, metal/dielectric) is patterned using a damascene process. In an embodiment, as a part of patterning the metal/ferromagnetic metal, a Ta barrier is deposited subsequent to an interlayer dielectric (ILD) etch. The deposition of the Ta barrier prevents diffusion of metal (typically Cu) to other layers that can cause a contamination of such layers. Thereafter, a ferromagnetic metal layer is conformably deposited. In an embodiment, the deposition of the ferromagnetic metal layer is followed by carbon hardmask (CHM) fill and recess operations. The CHM fill forms a CHM hard mask. Then, a wet-etch is performed to remove the ferromagnetic metal in the area where the CHM HM does not exist. This process is repeated for metal and ferromagnetic metals.

FIG. 1A is an illustration of a cross-section of a multilayer interconnect structure 100 according to an embodiment.

Figure 1B:
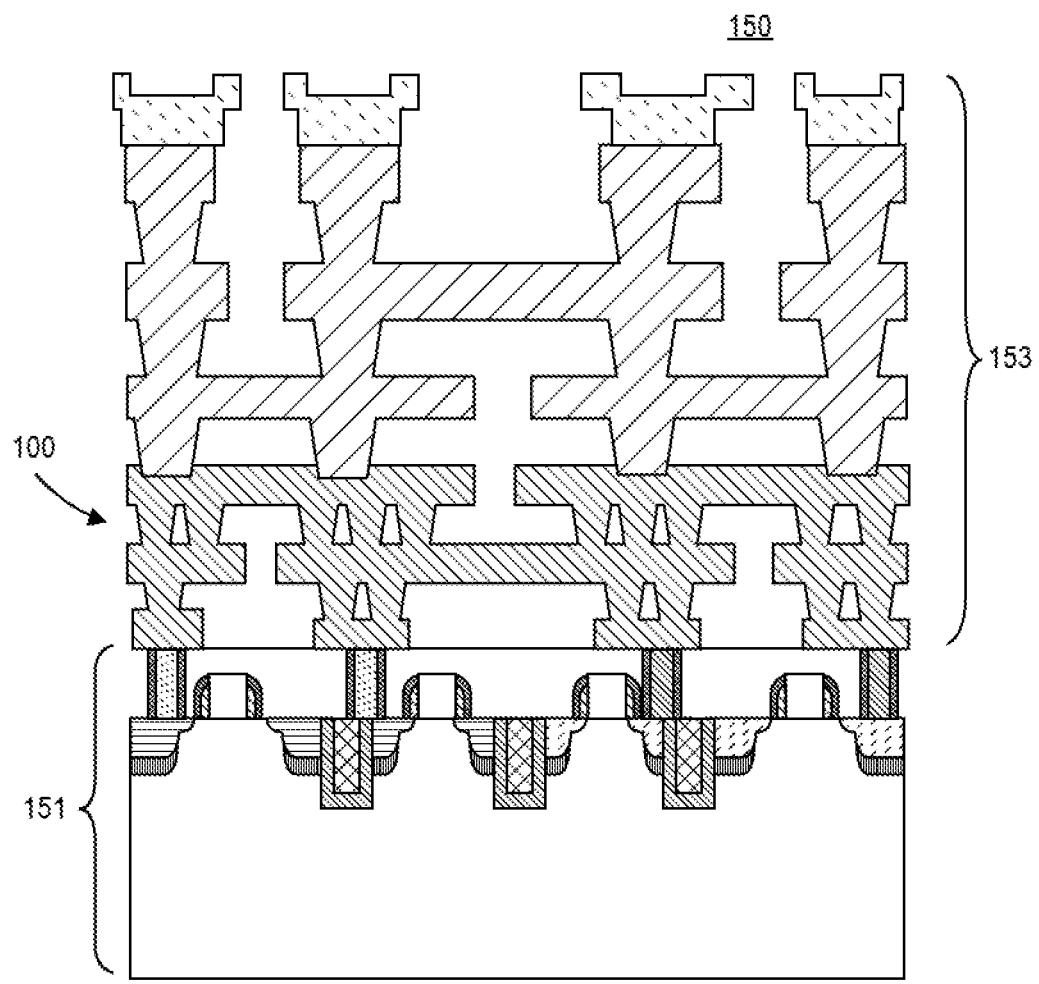
FIG. 1B is an illustration of a semiconductor die cross-section that includes front-end-of-line (FEOL) components and back-end-of-line (BEOL) components.

FIG. 1A shows interlayer dielectric 101, barrier layer 103, and a metal/ferromagnetic metal multilayer superlattice structure 105. In an embodiment, the multilayer superlattice structure 105 includes ferromagnetic layers 105a and metal layers 105b. FIG. 1B shows a semiconductor die cross-section 150 that includes front-end-of-line (FEOL) components 151 (transistors, capacitors and resistors) and back-end-of-line (BEOL) components 153 (interconnect structures). Referring to FIG. 1B, in an embodiment, the multilayer interconnect structure 100 can be used as a BEOL interconnect structure that connects FEOL components.

Referring to FIG. 1A barrier layer 103 is formed in a trench ondielectric layer 101. The superlattice structure 105 is formed on the barrier layer 103 in the trench. The superlattice structure 105 includes a plurality of metal layers 105b formed on a plurality of ferromagnetic layers 105a. In an embodiment, the dielectric layer 101 can be formed from silicon dioxide. In other embodiments, the dielectric layer 101 can be formed from other materials. In an embodiment, the barrier layer 103 can be formed from Ta. In other embodiments, the barrier layer 103 can be formed from other materials. In an embodiment, the ferromagnetic material 105a can be formed from Co, Fe, Ni, Mn and Gd. In other embodiments, the ferromagnetic material 105a can be formed from other materials. In an embodiment, the metal layers 105b is formed from Cu, Al, and CuAl alloys. In other embodiments, the metal layers 105b can be formed from other materials.

Figure 1C:
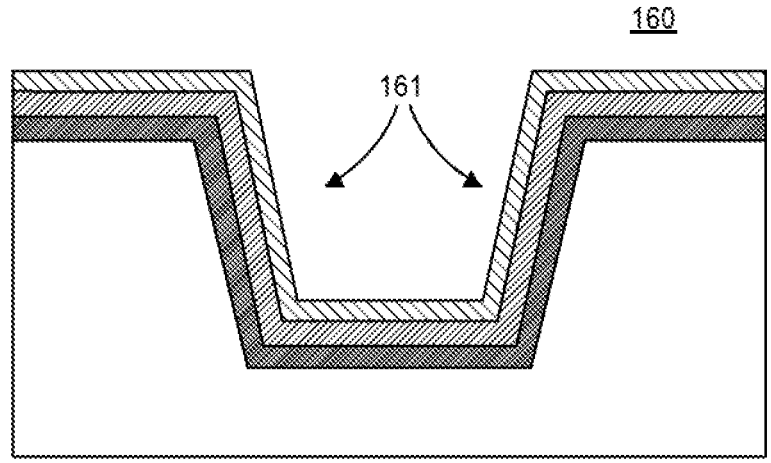
FIG. 1C is an illustration of a multilayered interconnect structure of a previous approach.

In operation, when an alternating electric current is applied to the interconnect structure 100, the ferromagnetic material 105a suppresses skin effects because of the negative permeability of ferromagnetic metals at RF frequencies. Accordingly, due to such suppression of skin effects the interconnect structure 100 provides higher performance and reliability. FIG. 1C shows multilayer structure 160 of a previous approach. Referring to FIG. 1C, the multilayers 161 are formed on the sidewalls of the trench which is disadvantageous because skin effects are not adequately addressed by multilayers formed in this manner. In an embodiment, the multilayer interconnect structure 100 avoids the disadvantages of multilayer structure 160 by utilizing the vertically stacked ferromagnetic and metal layers, 105a and 105b, that form the superlattice structure 105 (e.g., non-conductive voids/seams that reduce conductivity of the interconnect).

It should be appreciated, that as described herein, the skin effect can be suppressed in a metal/ferromagnetic metal multilayer due to the negative permeability of ferromagnetic metals in RF frequency. However, the fabrication of such a metal multilayer using a damascene process can present challenges because conventional physical vapor deposition (PVD) of the metal multilayer can create seams/voids in the associated trench. In a previous approach, a lift-off process is used. However, this process can cause contamination issues. In an embodiment, a method to pattern metal/ferromagnetic metal (e.g., can be metal/metal, metal/dielectric) using a damascene process is provided. In an embodiment, as a part of patterning the metal/ferromagnetic metal a Ta barrier is deposited subsequent to an ILD etch. The deposition of the Ta barrier is needed to prevent diffusion of metal (typically Cu) to other layers. Subsequently, a ferromagnetic metal layer is conformably deposited, which is followed by CHM fill and recess. The CHM fill forms a CHM hard mask. Then, a wet-etch is performed to remove the ferromagnetic metal in the area where the CHM HM does not exist. Thereafter, a non-ferromagnetic metal layer is formed on the ferromagnetic metal. In an embodiment, these operations are repeated to form the superlattice structure 105. In an embodiment, a characteristic of the structure that is formed is that the edge of the first ferromagnetic metal layer is thick, and that the layers above it have a similar shape. In other embodiments, different structural characteristics can be exhibited. In an embodiment, the metal material can include but is not limited to Cu, Al, and CuAl alloys. In an embodiment, the ferromagnetic material can include but is not limited to alloys of Co, Fe, Ni, Mn and Gd (magnetic elements). In other embodiments, this method can be used for magnetic domain wall memory. In this case, materials that can be use include but are not limited to Co, Fe, Ni, Pt, Pd, Ir, Gd, Mn, or Ru.

FIGS. 2A-2H are illustrations of cross-sections of an interconnect structure 200 corresponding to operations in a process to fabricate a metal and ferromagnetic metal multilayer interconnect with skin effect suppression according to an embodiment.

Figure 2A:
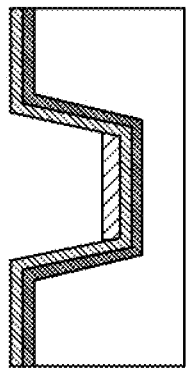
FIGS. 2A-2H are illustrations of cross-sections of an interconnect structure corresponding to operations in a process to fabricate a metal and ferromagnetic metal multilayered interconnect structure with skin effect suppression according to an embodiment.

Referring to FIG. 2A, after one or more operations that include an ILD etch and a barrier layer metal deposition the structure shown in FIG. 2A is formed.

Figure 2B:
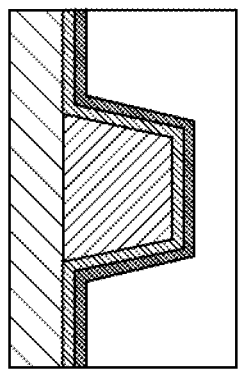

Referring to FIG. 2B, after one or more operations that result in the cross-section shown in FIG. 2A, a ferromagnetic metal is formed on the bottom and sidewalls of the trench on the top surface of the ILD. In an embodiment, the ferromagnetic metal can be formed in the trench by deposition. In other embodiments, the ferromagnetic metal can be formed in other manners. In an embodiment, the ferromagnetic material can include alloys of Co, Fe, Ni, Mn and Gd (magnetic elements). In other embodiments, the ferromagnetic can include other materials.

Figure 2C:
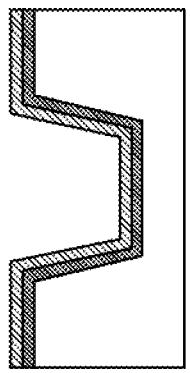

Referring to FIG. 2C, after one or more operations that result in the cross-section shown in FIG. 2B, CHM is formed in the trench. In an embodiment, the CHM is formed by deposition. In other embodiments, the CHM can be formed in other manners.

Figure 2D:
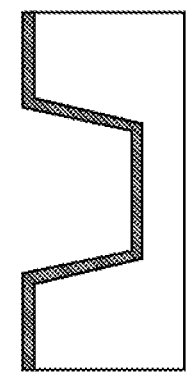

Referring to FIG. 2D, after one or more operations that result in the cross-section shown in FIG. 2C a CHM recess is formed. In an embodiment, the CHM recess can be formed by etching. In other embodiments, the CHM recess can be formed in other manners.

Figure 2E:
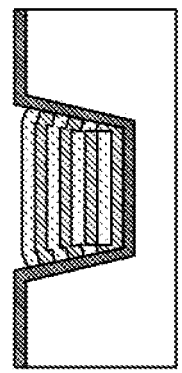

Referring to FIG. 2E, after one or more operations that result in the cross-section shown in FIG. 2D, the ferromagnetic material that is formed on the sides of the trench and on the top surface of the ILD material is removed. In an embodiment, the ferromagnetic material can be removed using ferromagnetic wet etch operations. In other embodiments, the ferromagnetic material can be removed in other manners.

Figure 2F:
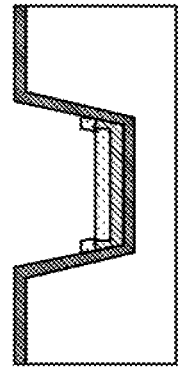

Referring to FIG. 2F, after one or more operations that result in the cross-section shown in FIG. 2E, the CHM material is removed. In an embodiment, the CHM material can be removed using a CHM ash operation. In other embodiments, the CHM material can be removed in other manners.

Figure 2G:
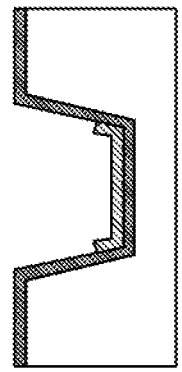

Referring to FIG. 2G, after one or more operations that result in the cross-section shown in FIG. 2F, the operations associated with FIGS. 2A through 2F are repeated with a non-magnetic metal. In an embodiment, the non-magnetic metal material can include but is not limited to Cu, Al, and CuAl alloys.

Figure 2H:
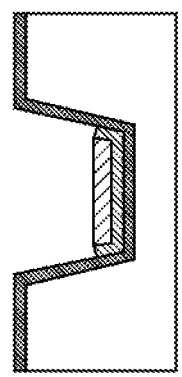

Referring to FIG. 2H, after one or more operations that result in the cross-section shown in FIG. 2G, the operations associated with FIGS. 2A through 2G are repeated, alternately with ferromagnetic and non-ferromagnetic material to create a superlattice of vertically layered ferromagnetic and non-ferromagnetic material.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 3:
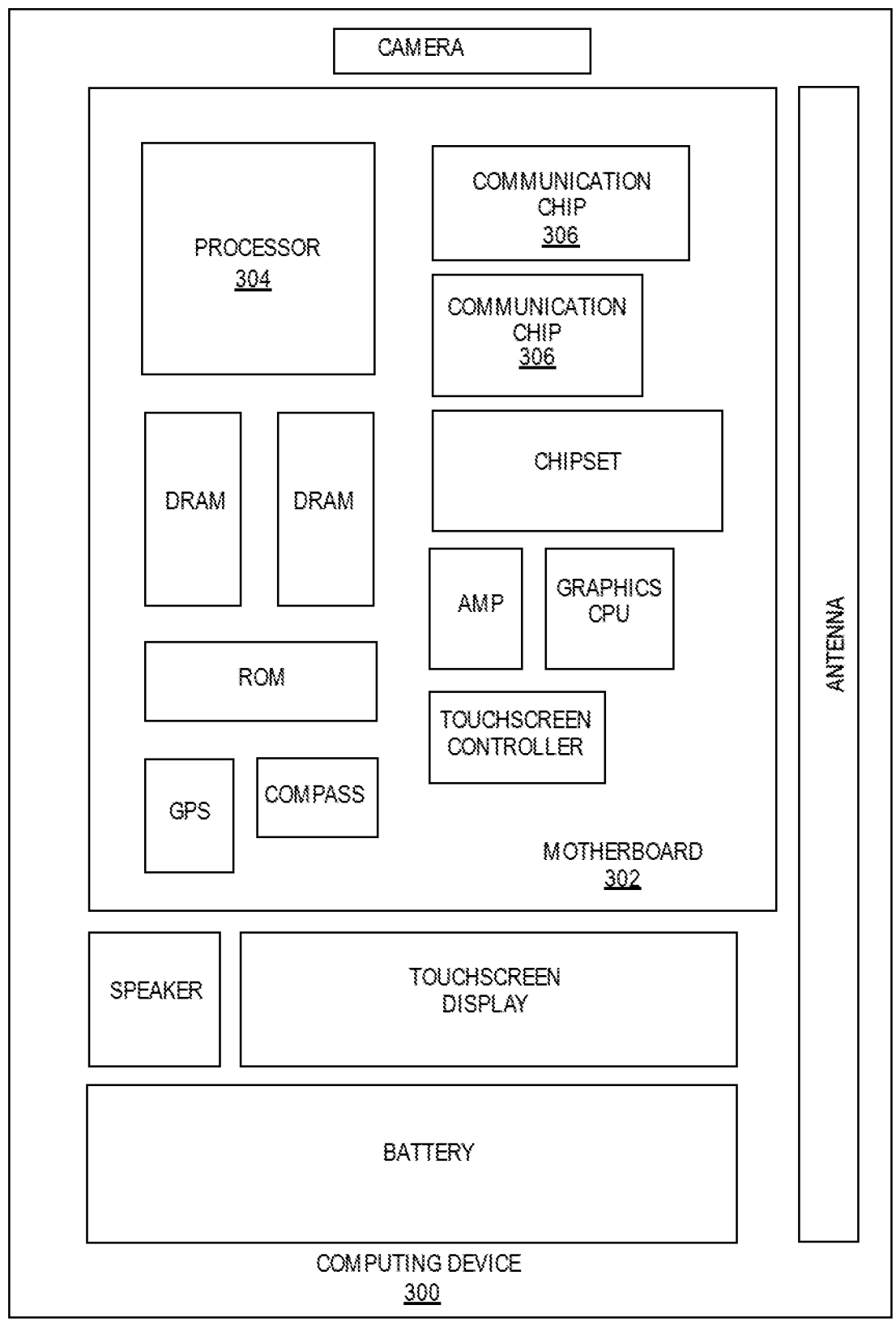
FIG. 3 illustrates a computing device in accordance with one implementation of an embodiment.

FIG. 3 illustrates a computing device 300 in accordance with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as MOS-FET transistors built in accordance with implementations of the invention.

In further implementations, another component housed within the computing device 300 may contain an integrated circuit die that includes one or more devices, such as MOS-FET transistors built in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
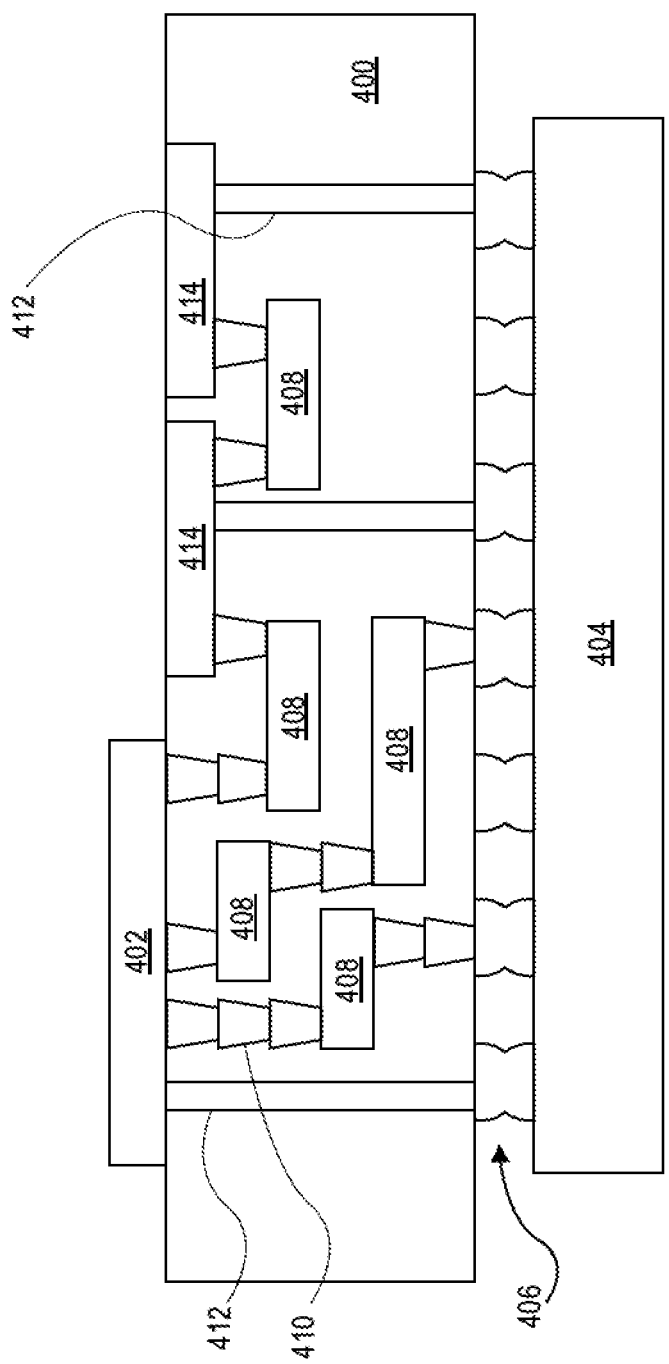
FIG. 4 illustrates an interposer that includes one or more implementations of an embodiment.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the invention, apparatuses or processes disclosed herein may be used in the fabrication of interposer 400.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

The following examples pertain to further embodiments. The various features of the different embodiments may be variously combined with some features included and others excluded to suit a variety of different applications.

Example embodiment 1: A multilayer conductive line including a dielectric layer, a Ta barrier layer on the dielectric layer, and a superlattice on the Ta barrier layer including, a plurality of interleaved ferromagnetic and non-ferromagnetic material.

Example embodiment 2: The multilayer conductive line of example embodiment 1, further comprising a trench in the dielectric layer wherein the Ta barrier layer and the superlattice are in the trench.

Example embodiment 3: The multilayer conductive line of example embodiment 1, wherein the superlattice is a metal/dielectric superlattice.

Example embodiment 4: The multilayer conductive line of claim 1, wherein the superlattice is a metal/metal superlattice.

Example embodiment 5: The multilayer conductive line of claim 1, wherein the ferromagnetic material includes an alloy of Co, Fe, Ni, Mn or Gd.

Example embodiment 6: The multilayer conductive line of claim 1, wherein the ferromagnetic material is a part of a magnetic domain wall memory and includes Co, Fe, Ni, Pt, Pd, Ir, Gd, Mn or Ru.

Example embodiment 7: The multilayer conductive line of example embodiment 1, 2, 3, 4, 5 or 6 wherein the multilayer conductive line is part of a damascene based connection structure.

Example embodiment 8: A damascene structure, including a plurality of vias in one or more dielectric layers; and a plurality of multilayer conductive lines in the vias, the comprising: a Ta barrier layer on the dielectric layer; and a superlattice on the Ta barrier layer including, a plurality of interleaved ferromagnetic and non-ferromagnetic material.

Example embodiment 9: The damascene structure of example embodiment 8, further comprising a trench in the dielectric layer wherein the Ta barrier layer and the superlattice are in the trench.

Example embodiment 10: The damascene structure of example embodiment 8, wherein the superlattice is a metal/dielectric superlattice.

Example embodiment 11: The damascene structure of example embodiment 8, wherein the superlattice is a metal/metal superlattice.

Example embodiment 12: The damascene structure of example embodiment 8, wherein the ferromagnetic conductor includes an alloy of Co, Fe, Ni, Mn or Gd.

Example embodiment 13: The damascene structure of example embodiment 8, wherein the ferromagnetic material is a part of a magnetic domain wall memory and includes Co, Fe, Ni, Pt, Pd, Ir, Gd, Mn or Ru.

Example embodiment 14: The damascene structure of example embodiment 8, 9, 10, 11, 12 or 13 wherein the multilayer conductive line is part of a damascene based connection structure.

Example embodiment 15: A method including forming a dielectric layer, forming a Ta barrier layer on the dielectric layer, and forming a superlattice on the Ta barrier layer including, a plurality of interleaved ferromagnetic and non-ferromagnetic material.

Example embodiment 16: The method of example embodiment 15, further comprising forming a trench in the dielectric layer and forming the Ta barrier layer and the superlattice in the trench.

Example embodiment 17: The method of example embodiment 15, wherein the superlattice is a metal/dielectric superlattice.

Example embodiment 18: The method of example embodiment 15, wherein the superlattice is a metal/metal superlattice.

Example embodiment 19: The method of example embodiment 15, wherein the ferromagnetic material includes an alloy of Co, Fe, Ni, Mn or Gd.

Example embodiment 20: The method of example embodiment 15, 16, 17 or 18 wherein the ferromagnetic material is a part of a magnetic domain wall memory and includes Co, Fe, Ni, Pt, Pd, Ir, Gd, Mn or Ru.

What is claimed is:

1. A multilayer conductive line, comprising:
   a dielectric layer;
   a Ta barrier layer on the dielectric layer; and
   a superlattice on the Ta barrier layer including,
     a plurality of interleaved ferromagnetic and non-ferromagnetic conductive material, wherein the multilayer conductive line is part of a damascene based connection structure.

2. The multilayer conductive line of claim 1, further comprising a trench in the dielectric layer wherein the Ta barrier layer and the superlattice are in the trench.

3. The multilayer conductive line of claim 1, wherein the superlattice is a non- ferromagnetic metal/ferromagnetic metal superlattice.

4. The multilayer conductive line of claim 1, wherein the superlattice is a metal/metal superlattice.

5. The multilayer conductive line of claim 1, wherein the ferromagnetic material includes an alloy of Co, Fe, Ni, Mn or Gd.

6. The multilayer conductive line of claim 1, wherein the ferromagnetic material is a part of a magnetic domain wall memory and includes Co, Fe, Ni, Pt, Pd, Ir, Gd, Mn or Ru.

7. A damascene structure, comprising:
   a plurality of vias in one or more dielectric layers; and
   a plurality of multilayer conductive lines in the vias, comprising:
   a Ta barrier layer on the dielectric layer; and
   a superlattice on the Ta barrier layer including,
     plurality of interleaved ferromagnetic and non-ferromagnetic material.

8. The damascene structure of claim 7, further comprising a trench in the dielectric layer wherein the Ta barrier layer and the superlattice are in the trench.

9. The damascene structure of claim 7, wherein the superlattice is a metal/dielectric superlattice.

10. The damascene structure of claim 7, wherein the superlattice is a metal/metal superlattice.

11. The damascene structure of claim 7, wherein the ferromagnetic material includes an alloy of Co, Fe, Ni, Mn or Gd.

12. The damascene structure of claim 7, wherein the ferromagnetic material is a part of a magnetic domain wall memory and includes Co, Fe, Ni, Pt, Pd, Ir, Gd, Mn or Ru.

13. The damascene structure of claim 7, wherein the multilayer conductive line is part of a damascene based connection structure.

14. A method, comprising:
   forming a dielectric layer;
   forming a trench in the dielectric layer;
   forming a Ta barrier layer in the trench in the dielectric layer; and
   forming a superlattice on the Ta barrier layer in the trench, the superlattice including,
      plurality of interleaved ferromagnetic and non-ferromagnetic conductive material.

15. The method of claim 14, wherein the superlattice is a metal/dielectric superlattice.

16. The method of claim 14, wherein the superlattice is a metal/metal superlattice.

17. The method of claim 14, wherein the ferromagnetic material includes an alloy of Co, Fe, Ni, Mn or Gd.

18. The method of claim 14, wherein the ferromagnetic conductor is a part of a magnetic domain wall memory and includes Co, Fe, Ni, Pt, Pd, Ir, Gd, Mn or Ru.

19. A multilayer conductive line, comprising:
   a dielectric layer;
   a Ta barrier layer on the dielectric layer;
   a superlattice on the Ta barrier layer including,
      plurality of interleaved ferromagnetic and non-ferromagnetic material; and
   a trench in the dielectric layer wherein the Ta barrier layer and the superlattice are in the trench.

* * * * *